United States Patent [19]
Camilletti et al.

[11] Patent Number: 5,516,596
[45] Date of Patent: May 14, 1996

[54] METHOD OF FORMING A COMPOSITE, ARTICLE AND COMPOSITION

[75] Inventors: Robert C. Camilletti; Loren A. Haluska; Keith W. Michael, all of Midland, Mich.

[73] Assignee: Dow Corning Corporation, Midland, Mich.

[21] Appl. No.: 358,292

[22] Filed: Dec. 19, 1994

[51] Int. Cl.$^6$ .................................................. B32B 9/00
[52] U.S. Cl. .......................... 428/698; 427/58; 427/387; 428/702; 106/287.12; 106/287.16; 106/287.3
[58] Field of Search .................. 427/58, 387; 428/698, 428/702; 106/287.12, 287.16, 287.3

[56] References Cited

U.S. PATENT DOCUMENTS 4,756,977  7/1988  Haluska et al. .......................... 428/704

*Primary Examiner*—Bernard Pianalto
*Attorney, Agent, or Firm*—Roger E. Gobrogge

[57] ABSTRACT

The present invention relates to a method of forming composite coatings on electronic substrates and the substrates coated thereby. The method comprises applying a coating comprising hydrogen silsesquioxane resin and a refractory fiber on an electronic substrate and heating the coated substrate at a temperature sufficient to convert the hydrogen silsesquioxane resin into a ceramic.

19 Claims, No Drawings

METHOD OF FORMING A COMPOSITE, ARTICLE AND COMPOSITION

BACKGROUND OF THE INVENTION

The present invention relates to composite coatings formed from hydrogen silsesquioxane resin and refractory fibers. These coatings are useful for forming opaque dielectric layers on electronic substrates.

The use of hydrogen silsesquioxane derived ceramic coatings on substrates such as electronic devices is known in the art. For instance, Haluska et al. in U.S. Pat. No. 4,756,977 disclose a process for forming a silica coating on an electronic substrate wherein a solution of hydrogen silsesquioxane resin is applied to a substrate followed by heating the coated substrate in air at a temperature in the range of 200°–1000° C. This reference, however, does not describe the use of fibers within the coating.

Similarly, ceramic composite coatings comprising ceramic fibers within ceramic matrices are also known in the art. The art, however, does not describe the use of hydrogen silsesquioxane as the matrix nor the application of such coatings on electronic substrates.

The present inventors have now discovered that ceramic composite coatings containing refractory fibers can be formed on electronic devices for protection.

SUMMARY OF THE INVENTION

The present invention relates to a method of forming a coating on an electronic device and the device coated thereby. The method comprises first applying a composition comprising hydrogen silsesquioxane resin and refractory fibers onto the substrate. The coated substrate is then heated at a temperature sufficient to convert the hydrogen silsesquioxane into a ceramic.

The present invention also relates to a coating composition comprising hydrogen silsesquioxane resin and refractory fibers diluted in a solvent.

DETAILED DESCRIPTION OF THE INVENTION

The present invention is based on the discovery that ceramic composite coatings can be formed from compositions comprising hydrogen silsesquioxane resin and refractory fibers. These coatings are useful on electronic devices because they provide excellent mechanical protection and dielectric protection. Additionally, the coatings are opaque such that visualization of the underlying device is impaired. The use of hydrogen silsesquioxane resin in this process is advantageous in that the coatings can be formed with low conversion temperatures and the coatings do not crack under stress since the hydrogen silsesquioxane resin does not undergo significant shrinkage.

As used in the present invention, the expressions "silica containing matrix" or "ceramic matrix" are used to describe the hard coating obtained after heating the hydrogen silsesquioxane resin. This coating contains both amorphous silica ($SiO_2$) materials as well as amorphous silica-like materials that may be not fully free of residual carbon (eg., Si—C or Si—OC), silanol (Si—OH) and/or hydrogen (which are obtained upon heating the silica precursor resin) and the refractory fibers. The expression "electronic substrate" is meant to include, but is not limited to, electronic devices or electronic circuits such as silicon based devices, gallium arsenide based devices, focal plane arrays, opto-electronic devices, photovoltaic cells and optical devices.

In the process of the present invention a ceramic coating is formed on a substrate by a process which comprises applying a coating composition comprising hydrogen silsesquioxane resin and refractory fibers onto the substrate and then heating the coated substrate at a temperature sufficient to convert the composition to a ceramic.

The hydrogen silsesquioxane resins (H-resin) which may be used in this invention include hydridosiloxane resins of the formula $HSi(OH)_x(OR)_yO_{z/2}$, in which each R is independently an organic group or a substituted organic group which, when bonded to silicon through the oxygen atom, forms a hydrolyzable substituent, $x=0-2$, $y=0-2$, $z=1-3$, $x+y+z=3$. Examples of R include alkyls such as methyl, ethyl, propyl, butyl, etc., aryls such as phenyl, and alkenyls such as allyl or vinyl. As such, these resins may be fully condensed $(HSiO_{3/2})_n$ or they may be only partially hydrolyzed (i.e., containing some Si—OR) and/or partially condensed (i.e., containing some Si—OH). Although not represented by this structure, these resins may contain a small number (eg., less than about 10%) of silicon atoms which have either 0 or 2 hydrogen atoms attached thereto due to various factors involved in their formation or handling.

The above H-resins and methods for their production are known in the art. For example, Collins et al. in U.S. Pat. No. 3,615,272, which is incorporated herein by reference, teach the production of a nearly fully condensed H-resin (which may contain up to 100–300 ppm silanol) by a process comprising hydrolyzing trichlorosilane in a benzenesulfonic acid hydrate hydrolysis medium and then washing the resultant resin with water or aqueous sulfuric acid. Similarly, Bank et al. in U.S. Pat. No. 5,010,159, which is hereby incorporated by reference, teach an alternative method comprising hydrolyzing hydridosilanes in an arylsulfonic acid hydrate hydrolysis medium to form a resin which is then contacted with a neutralizing agent.

Other hydridosiloxane resins, such as those described by Frye et al. in U.S. Pat. No. 4,999,397, hereby incorporated by reference, those produced by hydrolyzing an alkoxy or acyloxy silane in an acidic, alcoholic hydrolysis medium, those described in Kokai Patent Nos. 59-178749, 60-86017 and 63-107122, or any other equivalent hydridosiloxane, will also function herein.

The coating composition may also contain other ceramic oxide precursors. Examples of such ceramic oxide precursors include compounds of various metals such as aluminum, titanium, zirconium, tantalum, niobium and/or vanadium as well as various non-metallic compounds such as those of boron or phosphorous which may be dissolved in solution, hydrolyzed, and subsequently pyrolyzed, at relatively low temperatures and relatively rapid reaction rates to form ceramic oxide coatings.

The above ceramic oxide precursor compounds generally have one or more hydrolyzable groups bonded to the above metal or non-metal, depending on the valence of the metal. The number of hydrolyzable groups to be included in these compounds is not critical as long as the compound is soluble in the solvent. Likewise, selection of the exact hydrolyzable substituent is not critical since the substituents are either hydrolyzed or pyrolyzed out of the system. Typical hydrolyzable groups include, but are not limited to, alkoxy, such as methoxy, propoxy, butoxy and hexoxy, acyloxy, such as acetoxy, or other organic groups bonded to said metal or non-metal through an oxygen such as acetylacetonate. Specific compounds, therefore, include zirconium tetracetylacetonate, titanium dibutoxy diacetylacetonate, aluminum triacetylacetonate and tetraisobutoxy titanium.

When hydrogen silsesquioxane resin is to be combined with one of the above ceramic oxide precursors, generally it is used in an amount such that the final ceramic coating contains 0.1 to about 30 percent by weight modifying ceramic oxide.

The coating composition may also contain a platinum, rhodium or copper catalyst to increase the rate and extent of conversion to silica. Generally, any platinum, rhodium or copper compound or complex which can be solubilized will be functional. For instance, a composition such as platinum acetylacetonate, rhodium catalyst $RhCl_3[S(CH_2CH_2CH_2CH_3)_2]_3$, obtained from Dow Corning Corporation, Midland, Mich., or cupric naphthenate are all within the scope of this invention. These catalysts are generally added in an amount of between about 5 to 1000 ppm platinum, rhodium or copper based on the weight of hydrogen silsesquioxane resin.

The refractory fibers used herein are known in the art and can comprise any fibers which are compatible with the hydrogen silsesquioxane and which can withstand the heating. Many of these fibers are commercially available. Examples of suitable fibers include those of silicon carbide, silicon nitride, silicon carbide deposited on a carbon core, aluminum borate, aluminum oxide, silicon oxide, silicon carbide containing titanium, silicon oxycarbides, silicon oxycarbonitrides, carbon, graphite, aramide, organics and the like. These fibers may contain any desirable number of filaments per tow and have a size in the range of less than about 1 micrometers (eg., 0.1 micrometers) to about 500 micrometers.

Examples of specific fibers include silicon carbide fibers with a diameter in the range of 10–20 micrometers manufactured by Nippon Carbon and sold under the trade name "Nicalon"; fibers comprising silicon carbide deposited on a carbon core with a diameter of about 143 micrometers manufactured by Avco and designated "SCS-6"; alumina-boria-silica fibers with a diameter of about 10–12 micrometers manufactured by 3M and sold under the tradenames "Nextel 312", "Nextel 440" and "Nextel 480"; $Al_2O_3$ fibers with a diameter of about 20 micrometers manufactured by Du Pont under the designation "FP"; $SiO_2$ fibers with a diameter of about 8–10 micrometers manufactured by J. P. Stevens; $Al_2O_3$—$SiO_2$ fibers with a diameter in the range of about 9–17 micrometers manufactured by Sumitomo; silicon carbide fibers containing titanium with a diameter in the range of 8–10 micrometers manufactured by Ube and sold under the tradename "Tyranno"; silicon carbide fiber with a diameter in the range of about 6–10 micrometers manufactured by Avco; silicon oxycarbonitride fibers with a diameter in the range of about 10–15 micrometers manufactured by Dow Corning designated "MPDZ" and "HPZ"; silicon carbide fibers with a diameter in the range of about 10–15 micrometers manufactured by Dow Corning designated "MPS"; silicon nitride fibers such as those produced by Tonen or Rhone Poulanc, $Al_2O_3$—$ZrO_2$ fibers with a diameter of about 20 micrometers manufactured by Du Pont and Designated "PRD-166", carbon fibers such as those sold by Hitco and aramide fibers sold under the tradename "KEVLAR" by DuPont.

The refractory fibers used herein are chopped into short lengths for ease in coating. Any fiber length which can be manipulated into the desired coating can be used herein. Generally, the lengths are less than 1 centimeter with lengths in the range of between about 10 micrometers to 10 millimeters being preferred.

The amount of refractory fibers used in the present invention can also be varied over a wide range depending, for example, on the characteristics desired in the final coating. Generally, however, the refractory fibers are used in an amount less than about 90 volume percent to insure that enough resin is present to bind the refractory fibers. Obviously, smaller amounts of fibers (eg., 1–5 vol. %) can also be used. Preferred are fiber volumes in the range of between about 25 and 80%.

If desired, other materials may also be present in the coating composition. For instance, it is within the scope of the present invention to use a material which modifies the surface of the fiber for better adhesion or for better release. Such materials can include, for example, silanes such as glycidoxypropyltrimethoxysilane, mercaptopropyltrimethoxysilane, and vinyltriacetoxysilane. Similarly, it is within the scope of the invention to include suspending agents in the coating composition. These and other optional components are known to those skilled in the art.

According to the process of the invention, the H-resin, refractory fibers and any optional components are applied to the surface of the electronic substrate. The surface of the electronic substrate can be bare (i.e., no passivation) or the circuit can have a passivation. Such passivation can be, for example, ceramic coatings such as silica, silicon nitride, silicon carbide, silicon oxynitride, silicon oxycarbide, etc. deposited by, for example, CVD, PVD, or sol-gel approaches. Such passivation is known to those skilled in the art. Likewise, the circuit can be pre or post interconnection.

The coating composition can be accomplished in any manner, but a preferred method involves dissolving the H-resin in a solvent and dispersing the fiber and any optional components therein. This dispersion is then applied to the surface of the electronic substrate. Various facilitating measures such as stirring and/or heating may be used to dissolve or disperse the H-resin and fiber and create a more uniform application material. Solvents which may be used include any agent or mixture of agents which will dissolve the hydrogen silsesquioxane resin and disperse the fiber to form a uniform liquid mixture without affecting the resultant coating. These solvents can include, for example, aromatic hydrocarbons such as benzene or toluene, alkanes such as n-heptane or dodecane, ketones, esters, ethers, or cyclic dimethylpolysiloxanes, in an amount sufficient to dissolve/disperse the above materials to the concentration desired for application. Generally, enough of the above solvent is used to form a 0.1–80 weight percent mixture, preferably 1–50 wt. percent.

If a liquid method is used, the liquid mixture comprising the H-resin, refractory fiber, solvent, and, any optional components is then coated onto the substrate. The method of coating can be, but is not limited to, spin coating, dip coating, spray coating or flow coating. Other equivalent means, however, are also deemed to be within the scope of this invention.

The solvent is then allowed to evaporate from the coated substrate resulting in the deposition of the hydrogen silsesquioxane resin and refractory fiber coating. Any suitable means of evaporation may be used such as simple air drying by exposure to an ambient environment, by the application of a vacuum or mild heat (eg., less than 50° C.) or during the early stages of the heat treatment. It is to be noted that when spin coating is used, the additional drying period is minimized as the spinning drives off the solvent.

Although the above described methods primarily focus on using a liquid approach, one skilled in the art would recognize that other equivalent means such as rapid thermal processing would also function herein and are contemplated to be within the scope of this invention.

The hydrogen silsesquioxane resin and refractory fiber coating is then typically converted to the ceramic by heating it to a sufficient temperature. Generally, the temperature is in the range of about 50° to about 1000° C. depending on the pyrolysis atmosphere. Preferred temperatures are in the range of about 50° to about 800° C. and more preferably 50°–500° C. Heating is generally conducted for a time sufficient to ceramify, generally up to about 6 hours, with less than about 3 hours being preferred.

The above heating may be conducted at any effective atmospheric pressure from vacuum to superatmospheric and under any effective oxidizing or non-oxidizing gaseous environment such as those comprising air, $O_2$, an inert gas ($N_2$, Ar, etc.), ammonia, amines, moisture, $N_2O$, hydrogen, etc.

Any method of heating such as the use of a convection oven, rapid thermal processing, hot plate, or radiant or microwave energy is generally functional herein. The rate of heating, moreover, is also not critical, but it is most practical and preferred to heat as rapidly as possible.

By the above methods a ceramic coating is produced on the substrate. The thickness of the coating can vary over a wide range (eg., up to 500 microns) as described above. These coatings smooth the irregular surfaces of various substrates (i.e. planarizing), they are relatively defect free, they have excellent adhesive properties, they provide mechanical and electrical protection and they are opaque. Moreover, the fibers provide added strength and toughness to the coating.

Additional coatings may be applied over these coatings if desired. These can include, for example, $SiO_2$ coatings, $SiO_2$/ceramic oxide layers, silicon containing coatings, silicon carbon containing coatings, silicon nitrogen containing coatings, silicon oxygen nitrogen coatings, silicon nitrogen carbon containing coatings, organic coatings, silicone coatings and/or diamond like carbon coatings. Methods for the application of such coatings are known in the art and many are described in U.S. Pat. No. 4,756,977, which is incorporated herein by reference. An especially preferred coating is silicon carbide applied by the chemical vapor deposition of silacyclobutane. This process is described in U.S. Pat. No. 5,011,706 which is incorporated herein by reference.

The following non-limiting example is included so that one skilled in the art may more readily understand the invention.

EXAMPLE

Hydrogen silsesquioxane resin, 1 g, produced by the method of Collins et al. in U.S. Pat. No. 3,615,272, 1 g silicon carbide whiskers from Tateho Chemical Industries Co. Ltd. (0.5×15.2 micrometers), 0.4 g glycidoxypropyltrimethoxysilane and 3.0 g cyclic polydimethylsiloxanes were mixed with a sonic probe to form a coating solution. An 11.25 sq. cm alumina panel was coated with the solution by using a 75 micrometer drawdown bar. The coated panel was air dried for 3 hours and pyrolyzed for 2 hours at 400° C. in air. The pyrolyzed coating was examined with a microscope and found to have no cracks at 1000× magnification. The coating thickness was 26 micrometers.

What is claimed is:

1. A method of forming a composite coating on an electronic substrate comprising:

applying a coating composition comprising hydrogen silsesquioxane resin and refractory fibers onto an electronic substrate, wherein the fiber is present in the coating composition in an amount of about 1 to 90 volume percent; and heating the coated electronic substrate at a temperature sufficient to convert the coating composition into a ceramic coating.

2. The method of claim 1 wherein the refractory fiber is carbon.

3. The method of claim 1 wherein the refractory fiber is selected from the group consisting of silicon carbide, silicon nitride, and aluminum oxide.

4. The method of claim 1 wherein the refractory fiber is an organic fiber.

5. The method of claim 1 wherein the refractory fiber is aramide fiber.

6. The method of claim 1 wherein the coated substrate is heated at a temperature in the range of between about 50° C. and about 800° C. for less than about 3 hours.

7. The method of claim 1 wherein the coating composition also contains a material which modifies the surface of the refractory fiber.

8. The method of claim 1 wherein the coating composition also contains a suspending agent.

9. The electronic substrate coated by the method of claim 1.

10. The method of claim 1 wherein the fiber is present in the coating composition in an amount of about 25 to 80 volume percent.

11. A composition comprising hydrogen silsesquioxane resin and between about 1 and 90 vol. % of a refractory fiber.

12. The composition of claim 11 wherein the fiber is present in the coating composition in an amount of about 25 to 80 volume percent.

13. The composition of claim 11 wherein the refractory fiber is carbon.

14. The composition of claim 11 wherein the refractory fiber is selected from the group consisting of silicon carbide, silicon nitride, and aluminum oxide.

15. The composition of claim 11 wherein the refractory fiber is an organic fiber.

16. The composition of claim 11 wherein the refractory fiber is aramide fiber.

17. The composition of claim 11 wherein the hydrogen silsesquioxane resin and refractory fiber are diluted to between about 0.5 and 80 wt. % solids in a solvent.

18. The composition of claim 11 also comprising a material which modifies the surface of the fiber.

19. The composition of claim 11 also comprising a suspending agent.

* * * * *